United States Patent
Jin et al.

(10) Patent No.: US 7,434,145 B2
(45) Date of Patent: Oct. 7, 2008

(54) EXTRACTING SOFT INFORMATION IN A BLOCK-COHERENT COMMUNICATION SYSTEM

(75) Inventors: Hui Jin, Annendale, NJ (US); Tom Richardson, South Orange, NJ (US); Vladimir Novichkov, Towaco, NJ (US)

(73) Assignee: QUALCOMM Incorporated, San Diego, CA (US)

( * ) Notice: Subject to any disclaimer, the term of this patent is extended or adjusted under 35 U.S.C. 154(b) by 767 days.

(21) Appl. No.: 10/815,413

(22) Filed: Apr. 1, 2004

(65) Prior Publication Data

US 2004/0196927 A1   Oct. 7, 2004

Related U.S. Application Data

(63) Continuation of application No. 10/637,844, filed on Aug. 8, 2003.

(60) Provisional application No. 60/459,677, filed on Apr. 2, 2003.

(51) Int. Cl.
*H03M 13/45* (2006.01)
(52) U.S. Cl. .................. 714/780; 375/341; 375/340
(58) Field of Classification Search ................. 714/780; 375/341, 340
See application file for complete search history.

(56) References Cited

U.S. PATENT DOCUMENTS

| | | | |
|---|---|---|---|
| 3,542,756 A | 11/1970 | Gallager | |
| 3,665,396 A | 5/1972 | Forney, Jr. | |
| 4,295,218 A | 10/1981 | Tanner | |
| 5,157,671 A | 10/1992 | Karplus | |
| 5,271,042 A | 12/1993 | Borth et al. | |
| 5,293,489 A | 3/1994 | Furui et al. | |
| 5,313,609 A | 5/1994 | Baylor et al. | |
| 5,392,299 A | 2/1995 | Rhines et al. | |

(Continued)

FOREIGN PATENT DOCUMENTS

GB   2354676   3/2001

(Continued)

OTHER PUBLICATIONS

PCT International Search Report dated Aug. 2, 2004, for International Appln. No. PCT/US2004/01087, which was filed on Apr. 2, 2004.

(Continued)

*Primary Examiner*—Stephen M. Baker
(74) *Attorney, Agent, or Firm*—Michael P. Straub; James K. O'Hare; Thomas R. Rouse (57) ABSTRACT

Data communication over a block-coherent channel in a communication system is described. Low-complexity demodulation techniques that allow good performance are described. A dwell, e.g., a set of block coherent symbols transmitted including a known symbol, e.g., a pseudo pilot symbol, are received, demodulated and decoded by a joint decoder/demodulator employing soft inputs, soft outputs, and interleaving of messages. Low-complexity SISO demodulator is suitable for processing pseudo-pilot modulated information corresponding to each of one or more dwells. The low-complexity method achieves good performance when turbo equalization is used. Some decoding and demodulation embodiments include independent phase estimates and updated independent phase estimates following the extrinsic principle to generate soft symbol values and soft bits.

34 Claims, 6 Drawing Sheets

U.S. PATENT DOCUMENTS

| | | | |
|---|---|---|---|
| 5,396,518 A | 3/1995 | How | |
| 5,457,704 A | 10/1995 | Hoeher et al. | |
| 5,526,501 A | 6/1996 | Shams | |
| 5,615,298 A | 3/1997 | Chen | |
| 5,671,221 A | 9/1997 | Yang | |
| 5,684,835 A * | 11/1997 | Kroeger et al. | 375/325 |
| 5,742,612 A | 4/1998 | Gourgue et al. | |
| 5,860,085 A | 1/1999 | Storman | |
| 5,864,703 A | 1/1999 | van Hook et al. | |
| 5,867,538 A | 2/1999 | Liu | |
| 5,892,962 A | 4/1999 | Cloutier | |
| 5,933,650 A | 8/1999 | van Hook et al. | |
| 5,968,198 A | 10/1999 | Hassan | |
| 6,002,881 A | 12/1999 | York et al. | |
| 6,073,250 A | 6/2000 | Luby et al. | |
| 6,195,777 B1 | 2/2001 | Luby et al. | |
| 6,205,188 B1 * | 3/2001 | Stott et al. | 375/344 |
| 6,247,158 B1 | 6/2001 | Smallcomb | |
| 6,266,758 B1 | 7/2001 | van Hook et al. | |
| 6,269,124 B1 * | 7/2001 | Nagayasu et al. | 375/262 |
| 6,298,438 B1 | 10/2001 | Thayer et al. | |
| 6,339,834 B1 | 1/2002 | Crozier et al. | |
| 6,397,240 B1 | 5/2002 | Fernando et al. | |
| 6,438,180 B1 | 8/2002 | Kavcic et al. | |
| 6,473,010 B1 | 10/2002 | Viyaev et al. | |
| 6,484,284 B2 | 11/2002 | Smallcomb | |
| 6,490,705 B1 | 12/2002 | Boyce | |
| 6,526,538 B1 | 2/2003 | Hewitt | |
| 6,633,856 B2 | 10/2003 | Richardson et al. | |
| 6,697,441 B1 * | 2/2004 | Bottomley et al. | 375/340 |
| 6,718,504 B1 | 4/2004 | Coombs et al. | |
| 6,731,700 B1 | 5/2004 | Yakhnich et al. | |
| 6,754,804 B1 | 6/2004 | Hudepohl et al. | |
| 6,756,872 B2 * | 6/2004 | Penther | 335/229 |
| 6,813,219 B1 * | 11/2004 | Blackmon | 367/134 |
| 6,925,107 B2 * | 8/2005 | Hagenauer et al. | 375/147 |
| 6,961,888 B2 | 11/2005 | Jin et al. | |
| 6,993,070 B1 * | 1/2006 | Berthet et al. | 375/232 |
| 7,016,440 B1 * | 3/2006 | Singer et al. | 375/350 |
| 7,027,533 B2 * | 4/2006 | Abe et al. | 375/341 |
| 7,095,812 B2 * | 8/2006 | Chan et al. | 375/341 |
| 7,099,270 B2 * | 8/2006 | Yamaguchi | 370/208 |
| 7,154,936 B2 * | 12/2006 | Bjerke et al. | 375/148 |
| 7,170,948 B2 * | 1/2007 | Berthet et al. | 375/267 |
| 7,173,974 B2 * | 2/2007 | Sindhushayana | 375/262 |
| 7,203,246 B2 * | 4/2007 | Ylitalo et al. | 375/267 |
| 7,224,758 B1 * | 5/2007 | Banister | 375/358 |
| 7,247,728 B2 * | 7/2007 | Luithle et al. | 375/148 |
| 7,277,509 B2 * | 10/2007 | Liljestrom | 375/344 |
| 7,292,654 B2 * | 11/2007 | Simon et al. | 375/329 |
| 2004/0034828 A1 | 2/2004 | Hocevar | |
| 2005/0053128 A1 * | 3/2005 | Shearer et al. | 375/232 |
| 2005/0157820 A1 * | 7/2005 | Wongwirawat et al. | 375/326 |

FOREIGN PATENT DOCUMENTS

WO   04079563   9/2004

OTHER PUBLICATIONS

Richardson et al. The capacity of low-density parity-check codes under message-passing Decoding, IEEE Transactions on Information Theory; pp. 599-618, Feb. 2001, (same inventor) whole document.

Paranchych et al. Performance of a digital symbol synchronizer in cochannel interference and noise, IEEE Transactions on Communications, pp. 1945-1954; Nov. 2000, whole document.

NN77112415. Digital Encoding of Wide Range Dynamic Analog Signals, IBM Tech. Disclosure Bulletin, Nov. 1, 1997, vol. No. 20; Issue No. 6; pp. 2415-2417, whole document.

NN9210335. Hierarchical Coded Modulation of Data with Fast Decaying Probability Distributions, IBM Tech. Disclosure Bulletin, Oct. 1992, vol. No. 35; Issue No. 5; pp. 335-336, whole document.

Sorokine, V. et al. Innovative coding scheme for spread-spectrum communications, The Ninth IEEE International Symposium on Indoor and Mobile Radio Communications, pp. 1491-1495, vol. 3; Sep. 1998, whole document.

T. Moors and M. Veeraraghavan, "Preliminary specification and explanation of Zing: An end-to-end protocol for transporting bulk data over optical circuits", pp. 1-55 (May 2001).

T. Richardson and R. Urbanke, "The Capacity of Low-Density Parity-Check Codes under Message-Passing Decoding", pp. 1-44 (Mar. 2001).

T. Richardson, A. Shokrollahi, R. Urbanke, "Design of Capacity-Approaching Irregular Low-Density Parity-Check Codes", pp. 1-43 (Mar. 2001).

T. Richardson and R. Urbanke, "An Introduction to the Analysis of Iterative Coding Systems", pp. 1-36.

Saied Hemati, Amir H. Banihashemi, VLSI circuits: Iterative decoding in analog CMOS, Proceedings of the 13th ACM Great Lakes Symposium on VLSI Apr. 2003, pp. 15-20.

Mohammad M. Mansour, Naresh R. Shanbhag, Session 11: Low-power VLSI decoder architectures for LDPC codes, Proceedings of the 2002 international symposium on Low power electronics and design Aug. 2002, pp. 284-289.

R. Blahut, "Theory and Practice of Error Control Codes", Library of Congress Cataloging in Publication Data, pp. 47-49, (May 1984).

W. W. Peterson and E.J. Weldon, Jr., "Error-Correcting Codes", Second Edition, The Massachusetts Institute of Technology, pp. 212-213, 261-263, 263, (1986).

Kong et al., "Interleaved Cyclic Redundancy Check (CRC) Code", ACSSC 2003, Nov. 2003, pp. 2137-2141.

Berrou, A., et al., "Near Shannon limit error-correcting coding and decoding: Turbo codes", Proceedings 1993 IEEE International Conference on communications, Geneva, Switzerland, pp. 1064-1070 (May 1993).

Jin et al., "Design of Low-Density Parity-Check Codes in Noncoherent Communication", International Symposium on information theory 2002.

Lampe, L., H-J et al., "Iterative Decision-feedback Differential Demodulation of Bit-Interleaved coded MDPSK for Flat Rayleigh Fading Channels" IEEE Transactions on Communications, IEEE vol. 49, No. 7, pp. 1176-1184, (Jul. 2001).

Peleg M., et al., "Iterative decoding for coded noncoherent MPSK communications over phase-noisy AWGN channel" IEE Proceedings: Communication, Institution of Electrical Engineers, GB, vol. 147, No. 2, pp. 87-95 (Apr. 14, 2000).

Proakis, John G., "Digital Communications" McGrawHill, pp. 272-273 XP002370408 (2001).

Raphaeli, D., et al., "Combined Turbo Equalization and Turbo Decoding", IEEE Communications Letters, vol. 2., No. 4, pp. 107-109 (Apr. 4, 1998).

Shamai et al., "Iterative decoding for coded noncoherent MPSK communication over pahse-noisy AWGN channel" IEEE proceedings Communication 2000.

Yan, Ming, "Channel Estimation," Internet Article, http://dsp.ucsd.edu/yanming/>retrived Mar. 1, 2006.

European Search Report EP04758785, European Search Authority-The Hague, Mar. 02, 2006.

* cited by examiner

EXTRACTING SOFT INFORMATION IN A BLOCK-COHERENT COMMUNICATION SYSTEM

RELATED APPLICATIONS

The present invention claims the benefit of U.S. Provisional Patent Application Ser. No. 60/459,677, filed Apr. 2, 2003 titled "METHODS AND APPARATUS FOR DATA TRANSMISSION IN A BLOCK-COHERENT COMMUNICATION SYSTEM" and is a continuation-in-part of pending U.S. patent application Ser. No. 10/637,844, filed Aug. 8, 2003 titled "METHODS AND APPARATUS FOR DATA TRANSMISSION IN A BLOCK-COHERENT COMMUNICATION SYSTEM".

FIELD OF THE INVENTION

The present invention is directed to methods and apparatus for data communication over a block-coherent channel and, more particularly, to methods and apparatus for joint demodulation and decoding for the purpose of forward error detection and/or correction.

BACKGROUND

A communication system requires noncoherent detection when it is infeasible for the receiver to maintain a reliable estimate for instantaneous channel gain (magnitude and, especially, phase). Noncoherent communication systems include, for instance, a wireless multiple access system where the mobile nodes have limited power and cannot afford to transmit high power known symbols, e.g., pilots, to enable reliable channel estimation. A noncoherent communication channel may possess some coherence properties. For example, a noncoherent communication channel may include coherent blocks, where a coherent block is a time interval during which the channel variations are negligibly small. Communication over such a channel is referred to as block-coherent communication.

Block-coherent communication may arise naturally in fast frequency-hopping orthogonal frequency division multiple (OFDM) access systems. In such systems information may be modulated onto a subset of available frequencies, called tones, in every symbol time. To enhance spectral efficiency and increase diversity gain, tones utilized are, in some cases, rapidly hopped across the entire utilized frequency band in every L symbols, e.g., L consecutive symbols are mapped to one tone, followed by another L symbols mapped to a different tone, and so on. When L is small, it is possible to assume the consecutive L symbols experience identical channel gain. Although the amplitudes of the gains of two consecutive sets of L symbols can be close, their phases are normally completely independent.

More precisely, a block-coherent communication system can be defined as follows: for a system represented in discrete time domain, the channel gain is an unknown complex random variable that generally remains the same for every L consecutive symbols but otherwise varies independently according to some distribution, e.g., the phase is uniformly distributed over [0, 2PI] and the magnitude is Rayleigh distributed.

For block-coherent communication the nominal modulation scheme is differential M-array phase-shift-keying (DMPSK). DMPSK carries the information in the phase differences between two successive symbols over the coherent block. For illustration, to transmit N×(L−1) MPSK information symbols $s(i)$, each of the N consecutive sets of L−1 symbols, denoted as $s(1), s(2), \ldots, s(L-1)$, is differentially encoded to transmitted symbols $t(0), t(1), t(2), \ldots, t(L-1)$ $t(0)$ is set to a known symbol, and $t(j)=t(j-1)\times s(j)$ for $j=1, \ldots, N-1$.

Modulation schemes other than DMPSK are possible. For instance, with the insertion of known symbols in a block, information symbols may be transmitted directly on other symbols instead of differentially. This modulation scheme may be referred to as pseudo-pilot modulation. It is apparent, however, that at most L−1 information symbols can be transmitted inside a dwell of length L due to the phase uncertainty. Hence we may assume a known symbol is present in each dwell. Using the notation in the above illustration, $t(0)$ is set to a known symbol, and the rest transmitted symbols are $t(j)=s(j)$ for $j=1, \ldots, L-1$.

With forward error-correction coding, a block-coherent communication system will normally include an encoder (which inserts structured redundancy into original data stream), a modulator, e.g. DMPSK, (which maps binary data bits to MPSK symbols), a demodulator (which extracts out soft information and feeds it to the decoder), and a decoder (which decodes the original message based on soft information from the demodulator).

With block-coherent reception, the received symbol $y(i)$ and the transmitted symbol $t(i)$ are related as follows:

$$y(i)=\alpha e^{j\Theta}t(i)+n(i),$$

where $\Theta$ is the unknown phase, $\alpha$ is the unknown (real) channel gain, and $n(i)$ is the additive noise component.

In most coded systems, a receiver applying iterative demodulation and decoding—a scheme henceforth referred to as turbo equalization—has significant performance gain over a non-iterative receiver. For instance, convolution and/or turbo coded DMPSK systems, investigated by Shamai et al. in "Iterative decoding for coded noncoherent MPSK communications over phase-noisy AWGN channel" published in IEEE Proceedings Communication 2000, demonstrates turbo-equalization performance within 1.3 dB of channel capacity and 1 dB better than traditional schemes.

It has been shown that for turbo equalization to be maximally effective, the code design should take the effect of iterative demodulation into account. The importance of code design and an effective way of achieving it are described in Jin and Richardson's paper "Design of Low-Density Parity-Check Codes in Noncoherent Communication," published in International symposium on information theory 2002. The approach therein improves the performance to within 0.7 dB of channel capacity.

While the performance of turbo equalization is important, for a communication system to be practical for use in a wide range of devices, e.g., consumer devices, it is important that the turbo equalization be capable of being implemented at reasonable cost. Accordingly, the ability to efficiently implement turbo equalization schemes used for a block-coherent communication system, e.g., in terms of hardware costs, can be an important consideration.

The practical challenges posed by turbo equalization, in the light of implementation cost, are (i) the complexity of soft-in soft-out (SISO) demodulator and (ii) the data interleaving necessary at the transmitter and the receiver.

One known method of implementing a SISO demodulator is to apply belief propagation, e.g. Bahl-Cocke-Jelinek-Raviv (BCJR) algorithm if DMPSK modulation is used. Such a demodulator requires considerable complexity. BCJR algorithm runs on a trellis structure resulted from quantizing the phase space [0, 2PI] into equally spaced phase points. For instance, a 8-level quantization forms 8 points, 0, ¼PI, ..., ⅞PI. Therefore, the unknown phase associated to a dwell can only be one of those points, so are the phases of the received symbols, given no additive noise. L symbols inside a dwell, each being one of the eight states, comprises the trellis structure. The information symbol determines the transition from the current state to the next state. On this trellis, BCJR algorithm returns a soft guess on the information symbol. The complexity of BCJR algorithm is linear in the cardinality of the state space.

Implementing belief propagation demodulation for pseudo-pilot modulation entails similar complexity—linear in the cardinality of the quantization space.

In view of the above, it is apparent that there is a need for methods and apparatus which address the complexity of the soft-in soft-out demodulation. There is a need in block coherent communications systems for low complexity demodulation methods and apparatus that achieve good performance.

SUMMARY OF THE INVENTION

The present invention is directed to methods and apparatus for data communication over a block-coherent channel. For simplicity, the symbols transmitted in one coherent interval are referred to as a dwell, in this application. The length of a dwell is L. A dwell, comprising L symbols, serves as a unit for information transmission purposes.

Various examples used to explain the invention involve the use of Gray mapped QPSK symbols, with constellation points S0=1+j, S1=−1+j, S2=−1−j, and S3=1−j on the complex plane. A pair of two bits, a.k.a. a dibit, maps to one QPSK symbol: a dibit 00 maps to S0; a dibit 01 maps to S1; a dibit 11 maps to S2; and a dibit 10 maps to S3. Symbolically, we use S(c1c2) to denote the QPSK symbol mapping for a dibit (c1 c2), then S(00)=S0, etc.

It can be appreciated the techniques described in the present application in the exemplary context of QPSK, can be easily generalized and are applicable to high order MPSK with such implementations being deemed within the scope of the present invention.

Various features of the present invention are directed to methods and apparatus for a low-complexity SISO demodulator suitable for processing pseudo-pilot modulated information corresponding to each of one or more dwells. The low-complexity method of the invention provides good performance under turbo equalization.

In summary, this is accomplished by first independently estimating the unknown phase based on each of L pairs of information, each pair including a received symbol y(i) and updated a priori information on a transmitted symbol t(i) feed from the decoder. That produces L independent estimations, one for each symbol index i. Secondly, a new phase estimation for an $i^{th}$ symbol may be formed by averaging of the estimation from the other L−1 symbols, following the extrinsic principle which is described, in C. Berrou, A. Glavieux, P. Thitimajshima, "*Near Shannon limit error-correcting coding and decoding: Turbo codes*" Proceedings 1993 IEEE International Conference on Communications, Geneva, Switzerland, May 1993, pp.1064-1070.

Finally, the new phase estimation can be used to generate soft information about the symbol (and thus the two bits associated with it). This technique does not require quantizing the unknown phase and thus entails little complexity.

In an exemplary SISO demodulation embodiment, a decoder feeds the demodulator soft messages, m(2$i$) and m(2$i$+1), for bits c(2$i$), c(2$i$+1) associated with QPSK symbol t(i). Soft messages can be in the form of log-likelihood ratio, meaning the logarithm of the ratio that the probability that bit c is a 0 over the probability that bit c is a 1, i.e., m(i)=log(p(c(i)=0)/p(c(i)=1). Log-likelihood ratios of both bits c(2$i$) and c(2$i$+1) can be manipulated to obtain the expected value of symbol t(i):

$$E(t(i))=(\tan h(m(2i)/2), \tan h(m(2i+1)/2)),$$

and the expected value of the conjugate of s(i):

$$E(t(i)^*)=(\tan h(m(2i)/2), -\tan h(m(2i+1)/2)).$$

Due to the distinctive property of tangent-hyperbolic function, simplification of this expected value by approximation is possible with little performance degradation. For example, assume soft-messages are quantized in ln(2) steps, an exemplary approximation is:

$$-\tfrac{3}{4} \text{ when } m\le -10 \; -\tfrac{1}{2} \text{ when } -10<m\le -6 \; -\tfrac{1}{4}\text{when}$$
$$-6<m\le -1 \tan h(m/2)=0 \text{ when } -1<=m<=1\tfrac{1}{4}$$
$$\text{when } 1<m<6\tfrac{1}{2} \text{ when } 6<=m<10\tfrac{3}{4} \text{ when } m>=10. \quad\text{Eq. (1)}$$

Under this approximation three bits suffice to represent both the real and complex component of the expected value of symbol t(i).

A known symbol t(0), which can be assumed for purposes of explaining the invention in an exemplary embodiment to be 1+j without loss of generality, inside the dwell deserves somewhat special treatment. Its expected value E(t(0)) is known and thus set to be t(0)=1+j, and E(t(0)*) is set to be t(0)*=1−j. This is equivalent to setting tan h(m/2)=1. In other embodiments, the known symbol t(0) may be a different known value, and E(t(0)) and E(t(0)*) may be set accordingly. Given y(i)=α$e^{jθ}$t(i)+n(i), multiplying y(i) with E(t(i)*) generates an estimation of α$e^{jθ}$, referred to as T(i), for every symbol inside the same dwell. T(0) is an estimation of α$e^{jθ}$ for the known symbol inside the dwell.

Therefore inside one dwell, we can obtain L independent estimates T(i) which include independent estimates of the unknown phase $e^{jθ}$. These independent estimates can now form a new set of L estimates which include new estimates of the unknown phase, T'(i), following the extrinsic principle, $$T'(i) = \left( \sum_{k=1}^{L-1, k \neq i} T(k) + aT(0) \right).$$ Eq. (2)

Subsequently, multiplying y(i) with the conjugate of T'(i) gives an approximation of $\alpha^2 t(i)+\alpha n(i)$; therefore, the soft messages of m(2$i$) and m(2$i$+1) will be proportional to the real and imaginary component of y(i)T'(i). Proper scaling, by shifting bits with truncation and/or saturation, converts them into the right form of log-likelihood ratio.

In principle, the weight coefficient "a" should be tuned adaptively during turbo equalization for optimal performance. In practice, however, an exemplary constant setting a=2 provides, in some implementations, near optimal performance. As a constant multiplication can be incorporated into the mapping step, when implementing Eq. (1) in software or hardware, this further simplifies implementation.

DETAILED DESCRIPTION OF THE INVENTION

Figure 1:
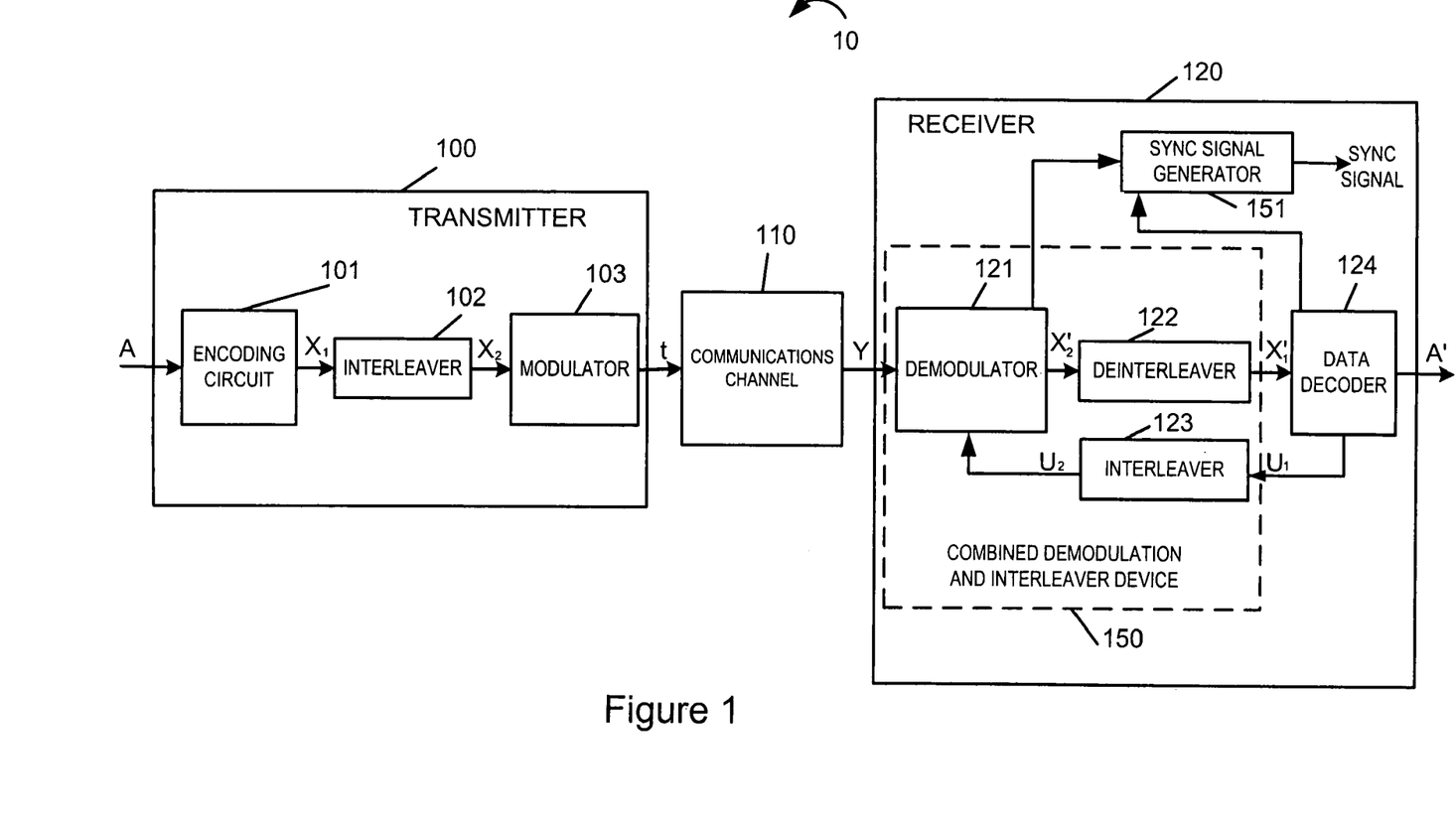
FIG. 1 illustrates an exemplary communication system including an encoder, a first interleaver, a modulator, a communications channel, a demodulator, a deinterleaver, a second interleaver, and a decoder in which the methods and apparatus of the present invention are employed.

FIG. 1 illustrates an exemplary general-purpose communication system 10 which implements the present invention. In some embodiments, communications system 10 may be, e.g., an OFDM communications system. The system 10 includes a transmitter 100 which is coupled by a communication channel 110 to a receiver 120. In other embodiments, the transmitter 100 may be part of a wireless terminal, the receiver may be part of a base station, and the communications channel may be an uplink communications channel. In some embodiments, the transmitter 100 may be part of a base station, the receiver may be part of a wireless terminal, and the communications channel may be an downlink communications channel. The transmitter 100 comprises a data encoding circuit, e.g., an encoder 101, an interleaver 102, and a modulator 103. The receiver comprises a demodulator 121, a deinterleaver 122, an interleaver 123, a data decoder 124, and a sync signal generator 151. Decoder 124 may be a Turbo decoder, an LDPC decoder, or another type of decoder. The encoder 101 maps an input binary data stream A to a structured binary data stream $X_1$ with redundancy. The interleaver 102 interleaves $X_1$ to produce another data stream $X_2$. The modulator 103 transforms the binary stream $X_2$ to physical signals S feasible for practical transmission, e.g. QPSK signals. The communications channel 110 may be, e.g., an air link. After modulation signals t are transmitted through the channel 110 to the receiver 120 and received as signals Y. The demodulator 121, deinterleaver 122, and interleaver 123 form a combined demodulation and interleaver device 150. The demodulator 121 and data decoder 124 supply symbol timing and other information to sync signal generator 151. The sync signal generator 151 generates from the supplied information a dwell sync signal which indicates the alignment of received symbols within a dwell. This information allows a device supplied with the dwell sync signal to determine which symbol within the dwell is being processed at any particular point in time. At the receiver side, demodulator 121 extracts information $X_2'$ from the noisy distorted reception Y. The deinterleaver 122 reorders the soft messages $X_2'$ to $X_1'$ corresponding to the original ordering of the code structure. And the decoder 123 tries to recover the original binary data stream A through the use of redundancy present in the coded data stream $X_2'$ produced by demodulation. The output from data decoder 124 is A' representing the receiver's estimated recovery of original data stream A. The data path from data decoder 124 to demodulation 121 represents a feedback loop. The feedback path includes interleaver 123. The feedback messages corresponding to $U_1$ are interleaved by an interleaver 123 to transform the ordering at the decoder to the ordering at the output of modulator 103 to producing messages corresponding to $U_2$.

Figure 2:
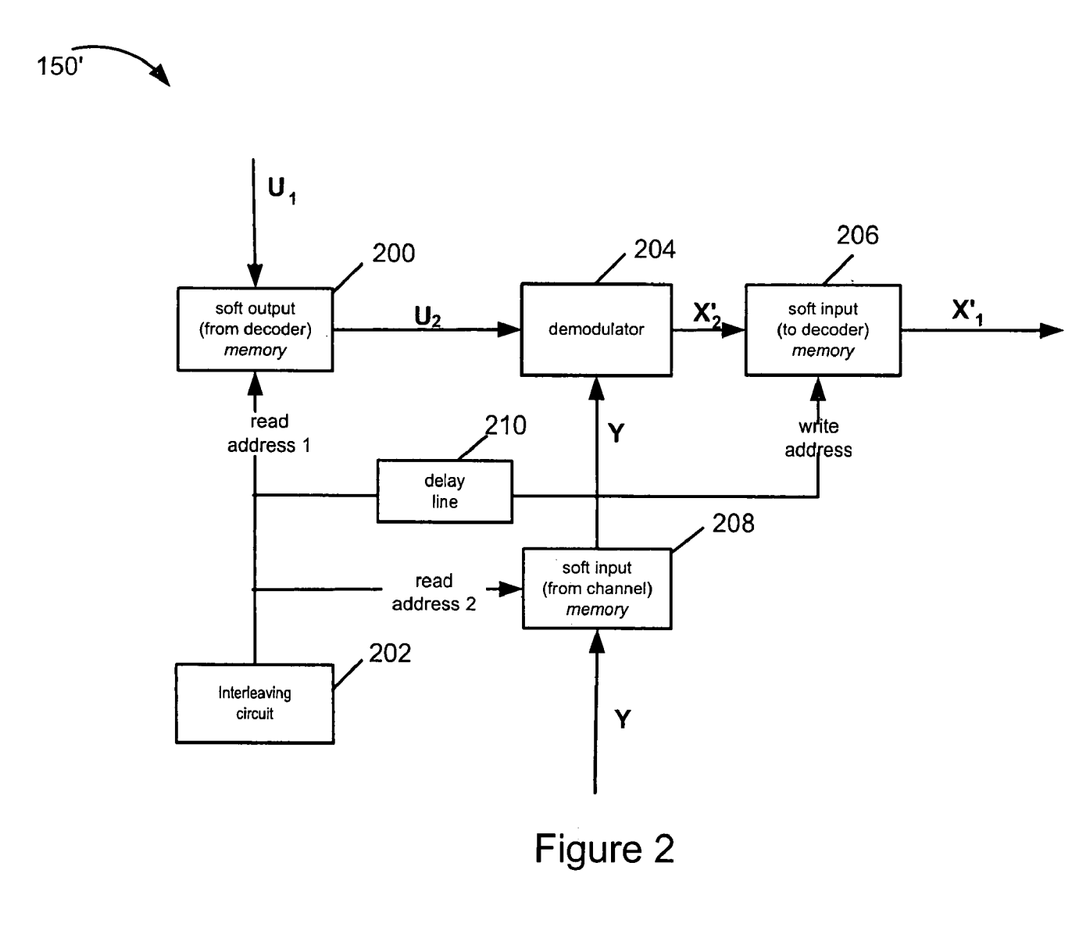
FIG. 2 illustrates an exemplary structure of joint demodulation and decoding with data interleaving and de-interleaving in an exemplary receiver in accordance with the present invention.

FIG. 2 is a drawing of an exemplary combined demodulation and interleaver device 150' that may be used in place of device 150 of FIG. 1. Exemplary demodulation and interleaver device 150' illustrates an exemplary implementation of joint decoding and demodulation at the receiver side, coupled with a data interleaving and de-interleaving control circuit 202, in accordance with the present invention. Feedback messages from the decoder, corresponding to $U_1$, are stored in soft-output (from decoder) memory (module 200). Soft-outputs are generated from received signals Y and stored in soft input (from channel) memory (module 208). The soft-outputs from the decoder memory(module 200) and soft-inputs from the channel receiver memory(module 208) are assumed to have the same configuration as the coded bits. Interleaving control circuit 202 generates the correct address to access both soft-outputs from the decoder memory and soft-inputs from the channel memory in the ordering of dwells, resulting in the forwarding of messages corresponding to $U_2$ and Y to demodulator 204. Demodulator 204 extracts information $X_2'$ from the noisy distorted reception Y. The same generated addresses, generated by the interleaving control circuit 202 for the access of information being input to the demodulator 204, are subjected to a delay introduced by a delay line 210. The output of delay line 210 serves as write addresses used to control the writing of the soft inputs of information $X_2'$, which are outputs of demodulator 204, into the decoder memory (module 206), and supplied to the decoder as $X_1'$.

Write and read addresses supplied to memory 202, 206 may cause soft values corresponding to known signals, e.g., pilot signals or pseudo pilot signals, to be written to a dummy location. These values are not important since known soft values corresponding to pilots or pseudo pilots can be used in their place. However, it is important to use actual addresses for information corresponding to data symbols since such values are not fixed and are important to data recovery. Writing pilot or pseudo pilot related values to dummy addresses is done in some embodiments to provide an easy way of maintaining timing synchronization with the stream of received symbols to be processed.

Figure 3:
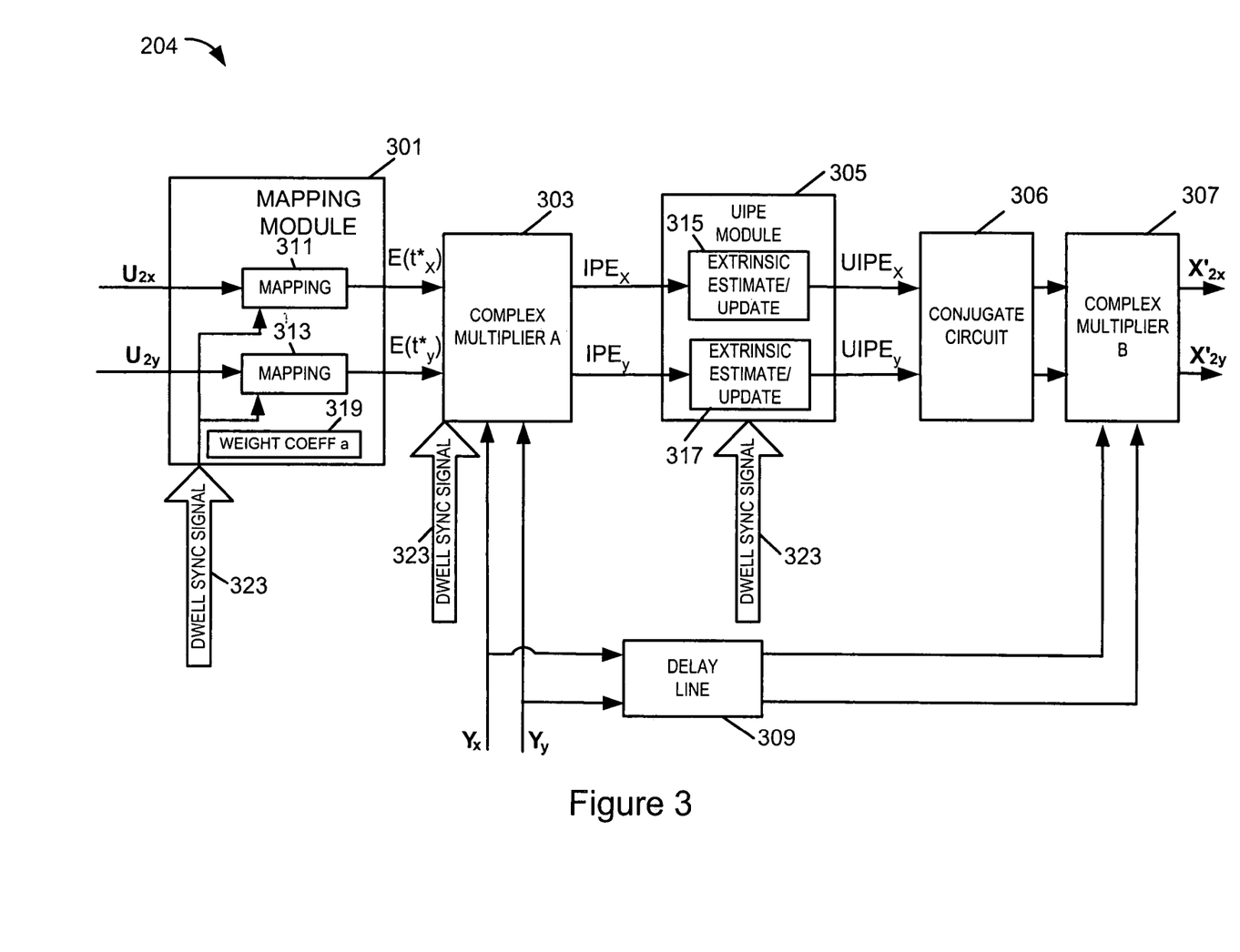
FIG. 3 illustrates an exemplary soft-in soft-out demodulator implemented in accordance with the present invention which may be used as the demodulator in FIG. 2.

FIG. 3 illustrates an exemplary demodulator 204 which performs demodulation in accordance with one embodiment of the invention. The demodulator 204 can be used as the exemplary demodulator in FIG. 2. In the illustration of FIG. 3, subscript x for an exemplary complex symbol, e.g., representing $U_2$, $X'_2$, Y, IPE, or UIPE, indicates the real component of the complex symbol, and subscript y indicates the imaginary component of the complex symbol. Thus, in the FIG. 3 example, $U_{2x}$ and $U_{2y}$ represent the I and Q parts of $U_2$, $Y_x$ and $Y_y$ represent the I and Q parts of Y and $X'_{2x}$ and $X'_{2y}$ represent the I and Y parts of $X'_2$.

In the demodulator 300, mapping module 301 maps soft messages m(2$i$) and m(2$i$+1) from the decoder, associated respectively to the real and imaginary components of symbol U(i), each to a three-bit value according to Eq.(1). Sub-module 311 performs the mapping of soft messages m(2$i$) associated with $U_x$ to a three-bit value, while sub-module 313 maps soft-messages m(2$i$+1) associated with $U_y$ to produce another three bit value. Mapping module 301 also includes a weighting coefficients "a" 319, which may be utilized, e.g., as a multiplier, by the mapping sub-modules (311, 313) with known symbols, e.g., a pseudo pilot symbol. In some embodiments, the weighting coefficient, "a" (319) may be set to a constant value, e.g., 2. In other embodiments, the weighting coefficient "a" may be adaptively tuned, e.g., during turbo equalization. This mapping of module 301 forms the expected value of real and imaginary component of t(i)* (conjugate of t(i)), and thus the expected value of t(i)*. The outputs from mapping module 301 are soft bits corresponding to complex symbol values. In some embodiments, a Look-Up-Table may be used for this mapping. Based upon dwell sync signal 323, the mapping modules 311, 313 can determine when a known symbol, e.g. a pseudo pilot symbol or pilot symbol, is being processed. The processing of the known symbol, e.g., pseudo pilot symbol or pilot symbol, may involve the use of a known value in place of the soft value supplied to the soft value input of mapping module 301. Thus mapping may be performed differently for known symbols, e.g., pseudo pilot or pilot symbols, than for data symbols. Similarly, based upon the dwell sync signal 323, complex multiplier A 303 may process values corresponding to known symbols, e.g., pseudo pilot symbols or pilot symbols, differently than symbols corresponding to data symbols. For example, first complex multiplier 303 may limit the multiplication in the case of a known symbol, e.g., a pseudo pilot symbol or pilot symbol, value to a real multiplication operation to avoid a rotation in phase which can occur in the case of complex multiplications performed on values corresponding to a data symbol in a dwell. The Complex multiplier A 303 produces the product of the expected value of t(i)* and received value y(i). The resulting product is the independent phase estimation (IPE) for each symbol in a dwell. Separate real ($IPE_x$) and imaginary ($IPE_y$) IPEs are generated. Module 305 processes the components of the complex IPE to generate an updated independent phase estimation (UIPE) which includes real and imaginary components for every symbol inside a dwell. Module 305 uses known symbol information, e.g., pilot or pseudo pilot symbol information, and knowledge of the dwell structure in the processing, e.g., the UIPE module 305 may determine from the dwell structure where a pilot or pseudo pilot will occur in a sequence of symbols. Dwell sync signal 323 is directed as an input to module 305. This processing to generate the UIPE can be implemented independently for each of the real and imaginary components. In FIG. 3, extrinsic estimate/update sub-module 315 processes $IPE_x$ to generate $UIPE_y$, while extrinsic estimate/update sub-module 317 processes $IPE_y$ to generate $UIPE_y$.

The generated $UIPE_x$ and $UIPE_y$ are input to a conjugate circuit 306. Conjugate circuit 306 performs a conjugation operation on the signals supplied thereto. In various implementations, conjugate circuit 306 and complex multiplier B 307 are combined into a single circuit.

A complex multiplier B 307 then multiplies the UIPE* with the received value y(i) to generate the new soft messages m'(2i) and m'(2i+1), up to a scaling constant. The received value y(i) might arrive from the same source as the input to module 303, delayed by a delay line module 309 that matches the pipeline delay in module 305. The output from complex multiplier B is $X'_2(i)$.

Figure 4:
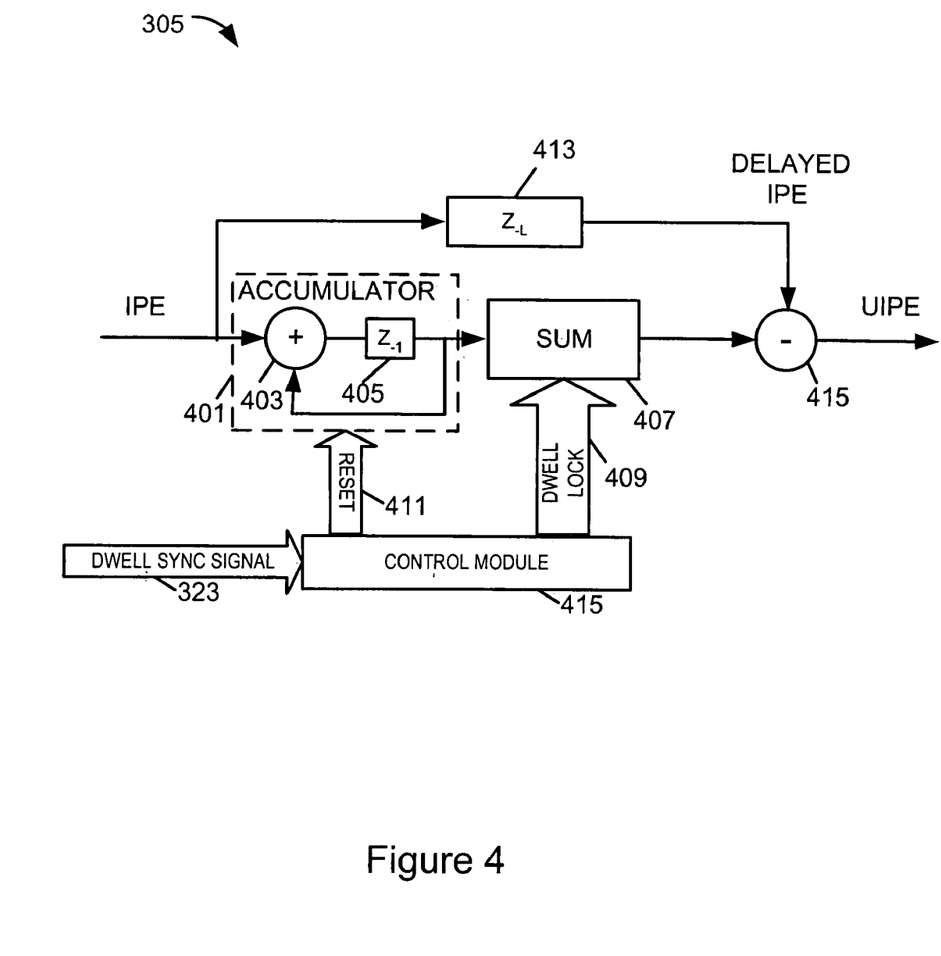
FIG. 4 is an illustration of an exemplary embodiment of a module implemented in accordance with the invention which produces updated independent phase estimates from independent phase estimates using the known extrinsic rule.

In one particular exemplary embodiment, module 305 produces the complex UIPE following the known extrinsic rule. FIG. 4 illustrates such an exemplary implementation of a module 400 implemented using the extrinsic rule, which can be used as the UIPE module 305 of FIG. 3. In such an embodiment, an accumulator 401 generates the summation of all the IPE T(i) in a dwell. The accumulator 401 includes a summing module 403, a delay element 405 (with a delay of 1 time interval corresponding to one symbol being processed), and a feedback loop. The output of the summing module 403 is input to the delay element 405; the output of the delay element 405 is fed back as an input to the summing module 403 to be summed with the IPE input signal. The output of the delay element 405 is also coupled to the input of a sum register 407. The summation of all IPE inside a dwell is locked, e.g., stored, in the sum register 407, where the lock is controlled by a signal dwell lock 409, indicating the boundary of dwells. In this exemplary embodiment, it is assumed that there are L symbols in a dwell. Reset signal 411 can be used to clear the accumulator 401 and restart summing for a subsequent dwell. Sum register 407 retains the locked sum value corresponding to the last dwell, while accumulator 401 starts accumulation of a sum corresponding to a new dwell. Module 400 also includes a control module 415 which can generate the reset signal 411 and the dwell lock signal 409. Dwell sync signal 323 is an input to the control module 415 and may be used as a trigger by control module to generate signals 411 and 409 at the appropriate times. Dwell sync signal 323 is generated from sync signal generator 151, and is used to provide synchronization capability which facilitates identifying dwell boundaries.

Module 400 also includes a delay element 413 (with a delay of L time intervals corresponding to L symbols of a dwell being processed) and a subtraction module 415. Delay element 413 performs a delay of L on each IPE symbol received as input. $Z_{-L}$ 413 is a pipeline delay element capable of storing multiple IPE values. The delay 413 can be implemented as a series of L unit delay elements. Other implementations are also possible. Subtraction module 415 receives as input the outputs of delay element 413 and the dwell symbol sum value locked in sum register 407. The output of subtraction module 415 is the UIPE. Subtracting the IPE of the ith symbol from the sum (of the dwell set including the ith symbol) produces the UIPE of the ith symbol, where the IPE is readily available through the use of a delay line. It should be appreciated that the IPE and the UIPE are complex values and that the processing shown in FIG. 4 is performed on each of the real and imaginary components of the IPE in parallel. Accordingly, each of the illustrated elements may be viewed as performing the individual processing operation on a complex value.

Figure 5:
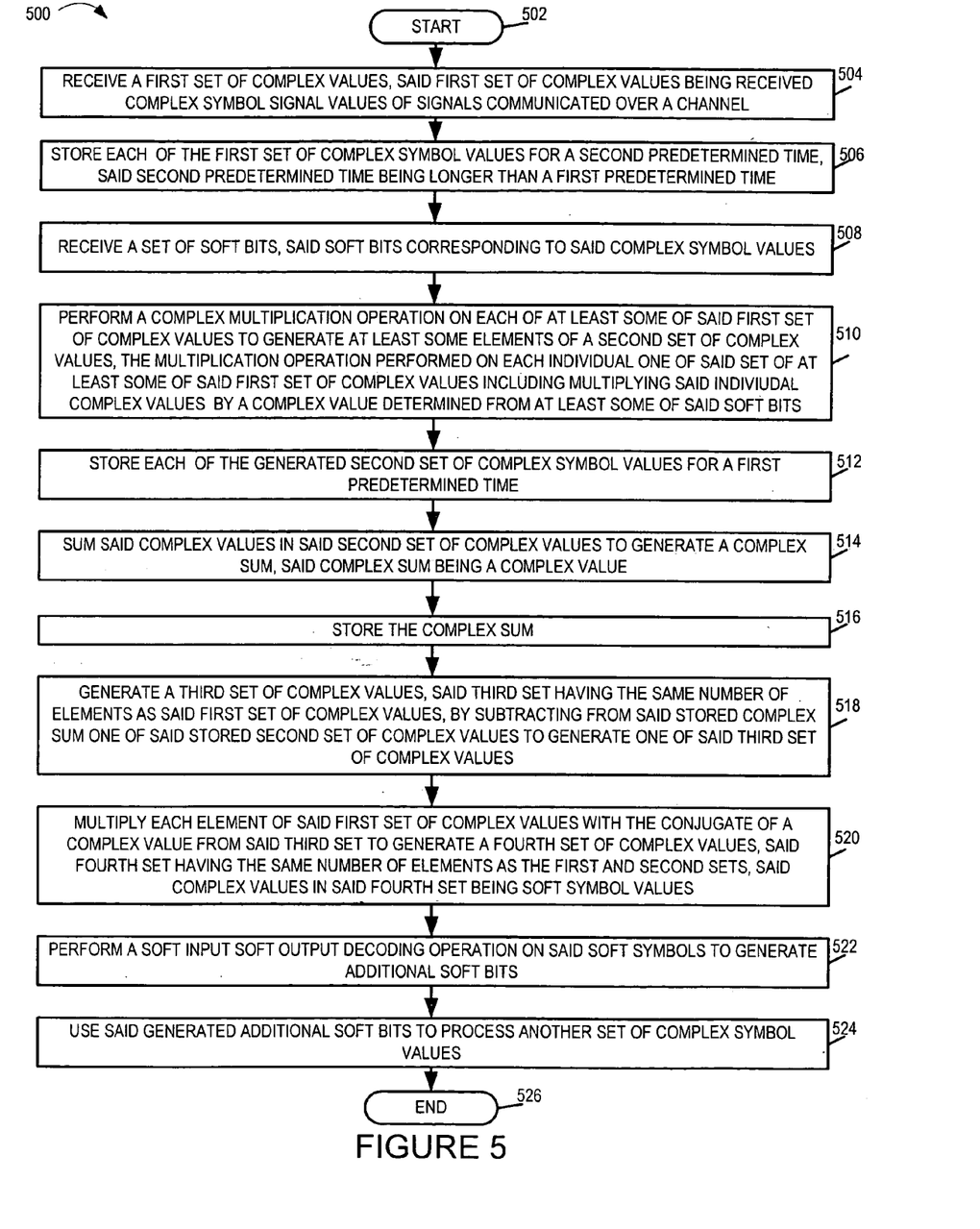
FIG. 5 is a flowchart illustrating an exemplary method in accordance with the present invention.

FIG. 5 is a flowchart 500 illustrating an exemplary method of operating a receiver, implemented in accordance with the invention, to perform demodulation operations in accordance with the present invention. The method starts in step 502, where the receiver is powered on and initialized. Operation proceeds to step 504, where the receiver is operated to receive a first set of complex values, said first set of complex values being received complex symbol values of signals communicated over a channel, e.g., a wireless communications uplink channel. In some embodiments, the first set of complex symbol values are produced by an OFDM modulated communications system. The communication may be a block-coherent communication system. In some embodiments, each set of complex values may correspond to seven received symbols. Other size blocks are possible. In some embodiments one of the received signals may be a known symbol, e.g., a pseudo pilot symbol or a pilot symbol. In step 506, the receiver is operated to store each of the first set of complex symbol values for a second predetermined time, said second predetermined time being longer than a first predetermined time. The second predetermined time is chosen to be long enough so that the first set of values will be available when generating the fourth set of values. The values may be stored in a delay line. Operation proceeds to step 508. In step 508, a set of soft bits, e.g., generated from a decoder is received. The received soft bits correspond to said complex symbol values. In some embodiments, there are at least two soft bits per received complex symbol value. In other embodiments, there are at least three soft bits per received complex symbol value.

In step 510, a multiplication module performs a complex multiplication operation on each of at least some of said first set of complex values to generate at least some elements of a second set of complex values, the multiplication operation performed on each individual one of said set of at least some of said first set of complex values including multiplying said individual complex values by a complex value determined from at least some of said soft bits. Note that the multiplication may not be performed on the known symbol, e.g., pilot or pseudo pilot symbol, with a predetermined value being output instead. In some embodiments, each complex multiplication operation is performed by performing two shift operations and an addition operation. In some embodiments, one of the received complex symbol values is not rotated, e.g., the phase is unchanged by the multiplication operation. In some embodiments, the complex symbol value that is not rotated occurs in a pre-selected location within the set of received complex symbol values. The multiplication for the complex symbol value that is not rotated may be known and independent of the soft bits. The complex symbol value that is not rotated may be a value representing a pilot symbol or a value representing a known symbol such as a pseudo pilot symbol. In step 512, the receiver is operated to store each of the generated second set of complex values for a first predetermined time. The first predetermined time in some embodiments is selected to be long enough to complete generation of the third set of complex values.

Next, in step 514, the receiver is operated to sum said complex values in said second set of complex values to generate a complex sum, said complex sum being a complex value. Then in step 516, the receiver is operated to store the complex sum. Next, in step 518, a third set of complex values is generated by subtracting from said stored complex sum one of said stored second set of complex values to generate one of said third set of complex values, said third set of complex values having the same number of complex values as said first set of complex values. Each of the second set of complex values is separately subtracted from the sum. The subtractions may be done sequentially or in parallel.

Next, in step 520, each element of said first set of complex values is multiplied with the conjugate of a complex value from said third set of complex values to generate a fourth set of complex values, said fourth set of complex values having the same number of elements as the first and second sets of complex values, said complex values in said fourth set being soft symbol values. Operation proceeds from step 520 to step 522.

In step 522, a soft input soft output decoding operation is performed on said soft symbol values to generate additional soft bits. In some embodiments, the soft input soft output decoding operation may be performed by a Low density parity check (LDPC) decoder. In other embodiments, the soft input soft output decoding operation is performed by a turbo decoder.

Next in step 524, the generated additional soft bits are used to process another set of complex symbol values. This may involve a repeat of steps 504 through 522. Operation terminates in step 526, e.g., when there are no more complex values from the communication channel to be processed.

Figure 6:
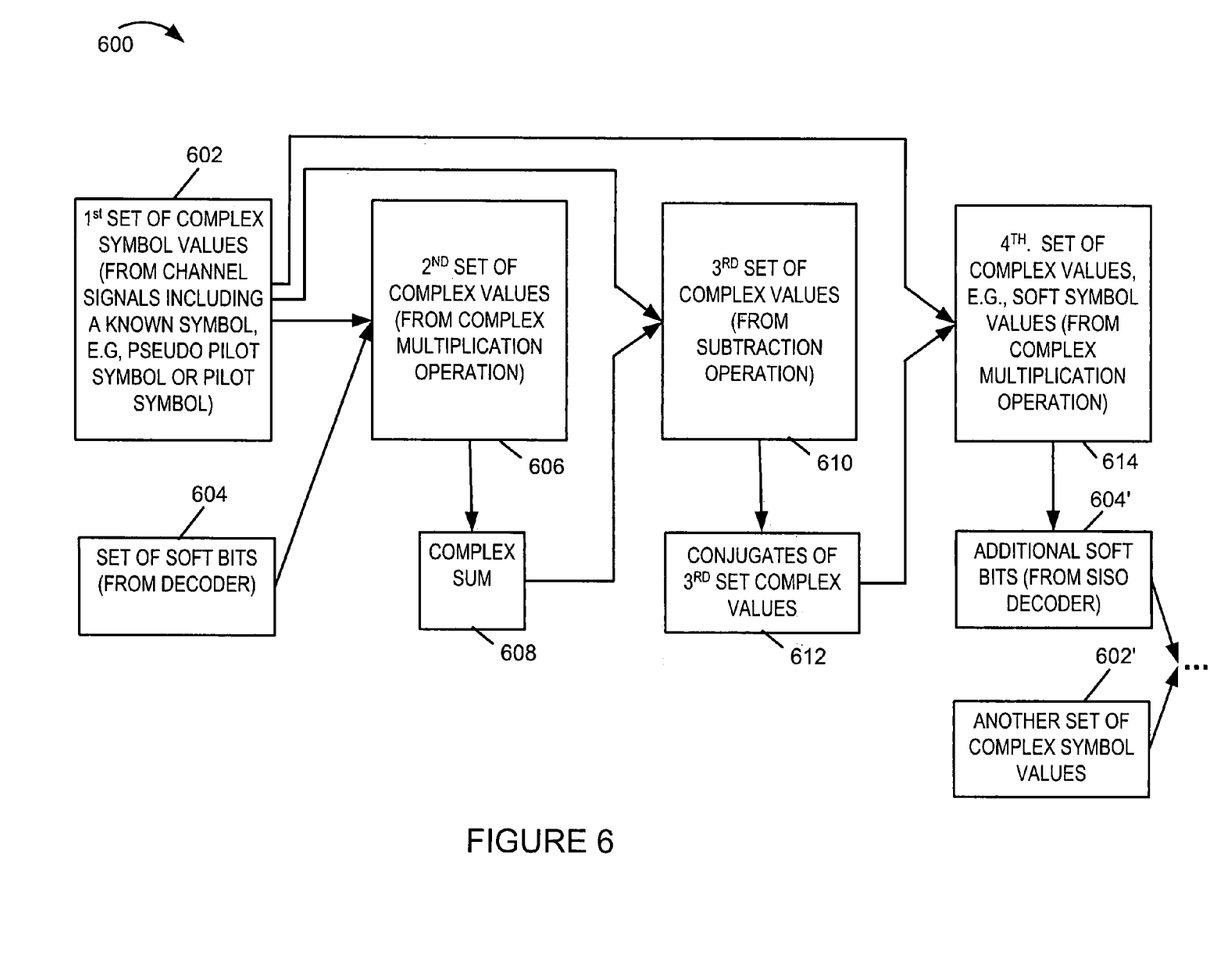
FIG. 6 is a drawing illustrating exemplary sets of information in accordance with the present invention.

FIG. 6 is a block diagram 600 illustrating exemplary sets of information that are generated and processed in accordance with the present invention. Block 602 is an exemplary $1^{st}$ set of complex symbol values. First set of complex symbol values may be from a received set of block coherent channel signals, e.g., seven symbols including one known symbol, e.g., a pseudo pilot signal or a pilot symbol, and six symbols conveying user information. Block 604 is an exemplary set of soft bits from the decoder, e.g., soft bits corresponding to the received complex symbol values of block 602.

Block 606 is an exemplary 2nd set of complex values, which includes at least some elements which are the result of a complex multiplication operation between at least some of the elements of $1^{st}$ set of complex values 602 and complex value(s) determined from at least some of the soft bits 604.

An exemplary complex sum 608 is generated from the second set of complex values 606.

Block 610 is an exemplary third set of complex values, the size of the $3^{rd}$ set of complex values being the same as size of the first or second set of complex values. Each element in the $3^{rd}$ set of complex values 610 is generated from a subtraction operation between the complex sum 608 and a member of the $1^{st}$ set of complex values 602. Block 612 is an exemplary set of values which are conjugates of the the $3^{rd}$ set of complex values 610.

Block 614 is an exemplary $4^{th}$ set of complex values, e.g., soft symbol values, which may be generated by a complex multiplication operations between the $1^{st}$ set of complex values 602 and the conjugates of the third set of complex values 612. Additional soft bits 604' may be generated as the result of a soft input soft output decoding operation performed on soft symbols 614. The additional soft bits 604' may be used to process another exemplary set of complex symbol values 602'.

In various ones of the above described embodiments, no rotation, e.g., change in phase, is caused by the first complex multiplication performed by complex multiplier 303 when processing a symbol value correspond to a known fixed value, e.g., a pilot value. This normally applies in the case where the known value has no (e.g., zero) imaginary component. In other embodiments, where the known value has an imaginary component, the first complex multiplication operation may introduce a change in phase, e.g., a phase rotation, by a fixed predetermined amount.

Various features of the present invention are implemented using modules. Such modules may be implemented using software, hardware or a combination of software and hardware. Many of the above described methods or method steps can be implemented using machine executable instructions, such as software, included in a machine readable medium such as a memory device, e.g., RAM, floppy disk, etc. to control a machine, e.g., general purpose computer with or without additional hardware, to implement all or portions of the above described methods, e.g., in one or more communications network nodes. Accordingly, among other things, the present invention is directed to machine-readable medium including machine executable instructions for causing a machine, e.g., processor and associated hardware, to perform one or more of the steps of the above-described method(s).

Numerous additional variations on the methods and apparatus of the present invention described above will be apparent to those skilled in the art in view of the above description of the invention. Such variations are to be considered within the scope of the invention. The methods and apparatus of the present invention may be, and in various embodiments are, used with CDMA, orthogonal frequency division multiplexing (OFDM), and/or various other types of communications techniques which may be used to provide wireless communications links between access nodes and mobile nodes. In some embodiments the access nodes are implemented as base stations which establish communications links with mobile nodes using OFDM and/or CDMA. In various embodiments the mobile nodes are implemented as notebook computers, personal data assistants (PDAs), or other portable devices including receiver/transmitter circuits and logic and/or routines, for implementing the methods of the present invention.

What is claimed:

1. A method of operating a receiver apparatus to generate soft values from a set of complex values communicated to said receiver apparatus, the method comprising operating said apparatus to perform the steps of:
   a) receiving a first set of complex values, said first set of complex values being received complex symbol values obtained from signals communicated over a channel;
   b) receiving a set of soft bits, said soft bits corresponding to said complex symbol values;
   c) performing a complex multiplication operation on each of at least some of said first set of complex values to generate at least some elements of a second set of complex values, the multiplication operation performed on each individual one of said set of at least some of said first set of complex values including multiplying said individual complex values by a complex value determined from at least some of said soft bits;
   d) summing said complex values in said second set of complex values to generate a complex sum, said complex sum being a complex value;
   e) generating a third set of complex values, said third set having the same number of elements as said first set of complex values, by separately subtracting from said complex sum one of said second set of complex values, each separate subtraction generating one of said third set of complex values; and
   f) multiplying each element of said first set of complex values with the conjugate of a complex value from said third set to generate a fourth set of complex values, said fourth set having the same number of elements as the first and second sets, said complex values in said fourth set being generated soft symbol values.

2. The method of claim 1, wherein said received set of soft values is generated from the output of a decoder.

3. The method of claim 1, wherein said separate subtractions performed in said step of generating a third set of complex values are performed sequentially.

4. The method of claim 1, wherein there are at least two soft bits per received complex symbol value.

5. The method of claim 1, wherein said first set of complex symbol values are produced by an OFDM modulated communications system.

6. The method of claim 1, wherein the communication signal is block-coherent communication signal.

7. The method of claim 1, wherein there are at least 3 soft bits per received complex symbol value.

8. The method of claim 7, wherein said complex multiplication operation on each of at least some of said first set of complex values is performed by performing no more than two shift operations and no more than one addition operation.

9. The method of claim 1, further comprising:
   storing each of the generated second set of complex symbol values for a predetermined time, said subtracting using symbol values from said second set which have been stored for said predetermined time.

10. The method of claim 9, further comprising:
    storing each of the first set of complex symbol values for a second predetermined time, said second predetermined time being longer than the first predetermined time; and wherein said first complex symbol values multiplied with said third complex symbol values have been delayed for said second predetermined time.

11. The method of claim 1, wherein one of the received complex symbol values is modified in phase by said step of performing said complex multiplication operation on each of at least some of said first set of complex values by a fixed preselected amount.

12. The method of claim 11, wherein said complex symbol value that is modified in phase by a fixed preselected amount occurs in a preselected location within the first set of received complex symbol values.

13. The method of claim 11, wherein for said complex symbol value that is modified in phase by a fixed preselected amount, the multiplication is known and independent of soft bits.

14. The method of claim 1, further comprising:
    performing a soft input soft output decoding operation on said soft symbol values to generate additional soft bits.

15. The method of claim 14, further comprising:
    using said generated additional soft bits to process another set of complex symbol values.

16. The method of claim 14, wherein said soft input soft output decoding operation is performed by a low density parity check decoder.

17. The method of claim 14, wherein said soft input soft output decoding operation is performed by a turbo decoder.

18. The method of claim 1, wherein one of the received complex symbol values is unmodified in phase by said step of performing said complex multiplication operation on each of at least some of said first set of complex values.

19. The method of claim 18, wherein said complex symbol value that is unmodified in phase occurs in a preselected location within the first set of received complex symbol values.

20. The method of claim 18, wherein for said complex symbol value that is unmodified in phase, the multiplication is known and independent of soft bits.

21. The method of claim 18, wherein said complex symbol value that is unmodified in phase is a pilot symbol value.

22. The method of claim 18, wherein said complex symbol value that is unmodified in phase is a known symbol value representing a pseudo pilot symbol.

23. A apparatus for generating soft values from a set of complex values, the apparatus comprising:
    a first complex multiplier including:
       i) a first input for receiving a first set of complex values, said first set of complex values being received complex symbol values obtained from signals communicated over a channel;
       ii) a second input for receiving a set of soft bits, said soft bits corresponding to said complex symbol values; and
       iii) circuitry for performing a complex multiplication operation on each of at least some of said first set of complex values to generate at least some elements of a second set of complex values, the multiplication operation performed on each individual one of said set of at least some of said first set of complex values including multiplying said individual complex values by a complex value determined from at least some of said soft bits;
    a summer coupled to said first complex multiplier for summing said complex values in said second set of complex values to generate a complex sum, said complex sum being a complex value;
    means for generating a third set of complex values, said third set having the same number of elements as said first set of complex values, by separately subtracting from said complex sum one of said second set of complex values, each separate subtraction generating one of said third set of complex values; and means for multiplying each element of said first set of complex values with the conjugate of a complex value from said third set to generate a fourth set of complex values, said fourth set having the same number of elements as the first and second sets, said complex values in said fourth set being generated soft symbol values.

24. The apparatus of claim 23, further comprising:
a decoder which generates soft output values, said decoder being coupled to said first input of said first complex multiplier.

25. The apparatus claim 23, wherein said means for generating a third set of complex values, includes a delay line for delaying complex values included in said second set of complex values and a subtractor coupled to said delay line.

26. The apparatus of claim 23, wherein there are at least two soft bits per received complex symbol value.

27. The apparatus of claim 23, wherein said means for multiplying each element of said first set of complex values with the conjugate of a complex value from said third set to generate a fourth set of complex values includes:
a conjugate circuit; and
a second complex multiplier.

28. An apparatus comprising;
a processor for use in a receiver apparatus to generate soft values from a set of complex values communicated to said receiver apparatus, the processor configured to:
  a) receive a first set of complex values, said first set of complex values being received complex symbol values obtained from signals communicated over a channel;
  b) receive a set of soft bits, said soft bits corresponding to said complex symbol values;
  c) perform a complex multiplication operation on each of at least some of said first set of complex values to generate at least some elements of a second set of complex values, the multiplication operation performed on each individual one of said set of at least some of said first set of complex values including multiplying said individual complex values by a complex value determined from at least some of said soft bits;
  d) sum said complex values in said second set of complex values to generate a complex sum, said complex sum being a complex value;
  e) generate a third set of complex values, said third set having the same number of elements as said first set of complex values, by separately subtracting from said complex sum one of said second set of complex values, each separate subtraction generating one of said third set of complex values; and
  f) multiply each element of said first set of complex values with the conjugate of a complex value from said third set to generate a fourth set of complex values, said fourth set having the same number of elements as the first and second sets, said complex values in said fourth set being generated soft symbol values.

29. A computer readable medium embodying machine executable instructions for controlling a receiver apparatus to implement a method of generating soft values from a set of complex values communicated to said receiver apparatus, the method comprising operating said apparatus to perform the steps of:
  a) receiving a first set of complex values, said first set of complex values being received complex symbol values obtained from signals communicated over a channel;
  b) receiving a set of soft bits, said soft bits corresponding to said complex symbol values;
  c) performing a complex multiplication operation on each of at least some of said first set of complex values to generate at least some elements of a second set of complex values, the multiplication operation performed on each individual one of said set of at least some of said first set of complex values including multiplying said individual complex values by a complex value detennined from at least some of said soft bits;
  d) summing said complex values in said second set of complex values to generate a complex sum, said complex sum being a complex value;
  e) generating a third set of complex values, said third set having the same number of elements as said first set of complex values, by separately subtracting from said complex sum one of said second set of complex values, each separate subtraction generating one of said third set of complex values; and
  f) multiplying each element of said first set of complex values with the conjugate of a complex value from said third set to generate a fourth set of complex values, said fourth set having the same number of elements as the first and second sets, said complex values in said fourth set being generated soft symbol values.

30. A apparatus for generating soft values from a set of complex values, the apparatus comprising:
first complex multiplier means including:
  i) first input means for receiving a first set of complex values, said first set of complex values being received complex symbol values obtained from signals communicated over a channel;
  ii) second input means for receiving a set of soft bits, said soft bits corresponding to said complex symbol values; and
  iii) means for performing a complex multiplication operation on each of at least some of said first set of complex values to generate at least some elements of a second set of complex values, the multiplication operation performed on each individual one of said set of at least some of said first set of complex values including multiplying said individual complex values by a complex value determined from at least some of said soft bits;
summer means coupled to said first complex multiplier means for summing said complex values in said second set of complex values to generate a complex sum, said complex sum being a complex value;
means for generating a third set of complex values, said third set having the same number of elements as said first set of complex values, by separately subtracting from said complex sum one of said second set of complex values, each separate subtraction generating one of said third set of complex values; and
means for multiplying each element of said first set of complex values with the conjugate of a complex value from said third set to generate a fourth set of complex values, said fourth set having the same number of elements as the first and second sets, said complex values in said fourth set being generated soft symbol values.

31. The apparatus of claim 30, further comprising:
decoder means which generates soft output values, said decoder means being coupled to said first input means of said first complex multiplier means.

32. The apparatus of claim 30, wherein said means for generating a third set of complex values, includes delay line means for delaying complex values included in said second set of complex values and subtractor means coupled to said delay line means.

33. The apparatus of claim 30, wherein there are at least two soft bits per received complex symbol value.

34. The apparatus of claim 30, wherein said means for multiplying each element of said first set of complex values with the conjugate of a complex value from said third set. to generate a fourth set of complex values includes:
 conjugate means; and
 second complex multiplier means.

* * * * *

UNITED STATES PATENT AND TRADEMARK OFFICE
CERTIFICATE OF CORRECTION

| | | |
|---|---|---|
| PATENT NO. | : 7,434,145 B2 | Page 1 of 1 |
| APPLICATION NO. | : 10/815413 | |
| DATED | : October 7, 2008 | |
| INVENTOR(S) | : Hui Jin | |

It is certified that error appears in the above-identified patent and that said Letters Patent is hereby corrected as shown below:

Col. 14, Claim 30, line 29, "A apparatus", should be,
--An apparatus--
Col. 14, Claim 30, lines 48-49, "summer means coupled to said first complex multiplier means for summing said complex values in said second", should be, --summer means coupled to said first complex multiplier; and means for summing said complex values in said second--
Col. 16, Claim 34, line 3, "said third set. to", should be, --said third set to--

Signed and Sealed this
Eighth Day of November, 2011

David J. Kappos
*Director of the United States Patent and Trademark Office*